(12) United States Patent
Hotta

(10) Patent No.: US 7,482,659 B2
(45) Date of Patent: Jan. 27, 2009

(54) SEMICONDUCTOR DEVICES WITH ELECTRIC CURRENT DETECTING STRUCTURE

(75) Inventor: Koji Hotta, Aichi-ken (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 0 days.

(21) Appl. No.: 11/634,265

(22) Filed: Dec. 6, 2006

(65) Prior Publication Data

US 2007/0126070 A1 Jun. 7, 2007

(30) Foreign Application Priority Data

Dec. 7, 2005 (JP) ............................. 2005-352815

(51) Int. Cl.
*H01L 23/62* (2006.01)
(52) U.S. Cl. ................ 257/355; 257/356; 257/330; 257/331; 257/332
(58) Field of Classification Search ................ 257/335, 257/356, 330–332
See application file for complete search history.

(56) References Cited

U.S. PATENT DOCUMENTS 5,536,958 A * 7/1996 Shen et al. ................ 257/356
6,411,133 B1 6/2002 Matsudai et al.
6,538,289 B1 3/2003 Topp et al.
2007/0176239 A1* 8/2007 Hshieh ...................... 257/355

FOREIGN PATENT DOCUMENTS

| DE | 198 23 768 | 2/1999 |
|---|---|---|
| JP | 06-085174 | 3/1994 |
| JP | 2001-016082 | 1/2001 |
| JP | 2001-358568 | 12/2001 |
| JP | 2002-517116 | 6/2002 |
| WO | WO 96/12346 | 4/1996 |

OTHER PUBLICATIONS

German Office Action dated Oct. 6, 2008.

* cited by examiner

*Primary Examiner*—Cuong Q Nguyen
*Assistant Examiner*—Trang Q Tran
(74) *Attorney, Agent, or Firm*—Finnegan, Henderson, Farabow, Garrett & Dunner, LLP

(57) ABSTRACT

A semiconductor device is provided with a main electrode of main switching elements region, a sensor electrode of sensor switching elements region, and a protective device formed between the main electrode and the sensor electrode. The protective device electrically connects the main electrode and the sensor electrode when a predetermined potential difference is produced between the main electrode and the sensor electrode. The semiconductor device can handle excessive voltage such as ESD generated between the sensor electrode and the gate electrode while simultaneously preventing gate drive loss from increasing.

3 Claims, 3 Drawing Sheets

SEMICONDUCTOR DEVICES WITH ELECTRIC CURRENT DETECTING STRUCTURE

CROSS REFERENCE TO RELATED APPLICATION

This application claims priority to Japanese Patent Application No. 2005-352815 filed on Dec. 7, 2005, the contents of which are hereby incorporated by reference into the present application.

BACKGROUND OF THE INVENTION

1. Field of the Invention

The present invention relates to a semiconductor device with a structure for detecting the magnitude of electric current that flows through the semiconductor device (electric current detecting function). Specifically, the present invention relates to a semiconductor device that is provided with the electric current detecting structure as well as a countermeasure against ESD (Electro Static Discharge).

2. Description of the Related Art

Generally, a semiconductor device is provided with a semiconductor substrate having a plurality of switching elements formed within the substrate. The switching element in this specification means a structure composed of semiconductor regions having different characters that switches on/off the electric current that flows between a pair of electrodes.

A semiconductor device having electric current detecting function has been developed. Typically, in order to detect the magnitude of the electric current that flows through the semiconductor device, the switching elements are partitioned into two groups. Specifically, by partitioning the electrode on the lower electric potential side into two, the switching elements become partitioned into two groups. A portion of the switching elements is electrically connected in common to one of the two electrodes, and the other portion of the switching elements is electrically connected in common to the other electrode. Accordingly, the switching elements are partitioned into two groups: a group connected to one of the two electrodes and a group connected to the other electrode. The electrode of the former is connected to a reference potential, and the electrode of the latter is connected to the reference potential via a current detector. In the present specification, the former electrode is referred to as "main electrode," and the latter electrode is referred to as "sensor electrode." Further, the switching elements that turn on/off the electric current that flows through the main electrode are referred to as "main switching elements," and the switching elements that turn on/off the electric current that flows through the sensor electrode are referred to as "sensor switching elements." The main switching elements and sensor switching elements are electrically connected in common to the electrode on the higher electric potential side though an electric device such as a motor. A common gate voltage is applied to gate electrodes of the main switching elements and sensor switching elements.

According to this semiconductor device, when a gate-on voltage is applied to the gate electrodes, the main switching elements and sensor switching elements both turn on, and the electric current flows through both the main switching elements and sensor switching elements. The magnitude of the electric current that flows through each switching element is same among the main switching elements and sensor switching elements. Therefore, a proportional relationship between the number of the main switching elements and the number of the sensor switching elements become equal to a proportional relationship between the magnitude of the electric current that flows through the main electrode and the magnitude of the electric current that flows through the sensor electrode. Therefore, by detecting the magnitude of the electric current that flows through the sensor electrode, the magnitude of electric current that flows through the main electrode can be derived.

By detecting the magnitude of electric current that flows through the semiconductor device, it becomes possible to detect a phenomena that an abnormally large current flows the semiconductor device. This phenomena is caused when the electric device connected to the semiconductor device is short-circuited. Accordingly, by providing the sensor switching elements, the sensor electrode, and a means for forcing the semiconductor device to turn off when the detected electric current exceeds a predetermined value, excessive current higher the predetermined value can be prevented from flowing through the semiconductor device, even when the electric device connected to the semiconductor device is short-circuited.

Generally, the number of the sensor switching elements is much smaller than the number of the main switching elements. Therefore, the gate input capacity (gate input capacity correlates to the area of a gate insulating layer) between the sensor electrode and gate electrodes of the sensor switching elements is smaller than the gate input capacity between the main electrode and gate electrodes of the main switching elements. Since the gate input capacity of the main switching elements is large, the ESD tolerance between the main electrode and gate electrodes of the main switching elements is high. On the other hand, since the gate input capacity of the sensor switching elements is small, the ESD tolerance between the sensor electrode and gate electrodes of the sensor switching elements is low. Therefore, when ESD is applied between the sensor electrode and gate electrodes of the sensor switching elements, the gate insulating layers of the sensor switching elements are easily destroyed.

In order to improve the ESD tolerance between the sensor electrode and gate electrodes of sensor switching elements, a technique is known that provides a zener diode between the sensor electrode and gate electrode. When ESD that reaches the breakdown voltage of the zener diode is applied between the sensor electrode and gate electrode, the zener diode experiences a breakdown. As a result, a voltage that is higher than the breakdown voltage of the zener diode is prevented from being applied to the gate insulating layers of the sensor switching elements. Therefore, the gate insulating layers of the sensor switching elements can be prevented from being destroyed.

The techniques associated with this type of technique are described in Japanese Laid-Open Patent Application Publication No. 1994-85174, Japanese Laid-Open Patent Application Publication No. 2001-358568, Japanese Laid-Open Patent Application Publication No. 2001-16082, and Japanese Laid-Open Patent Application Publication No. 2002-517116.

BRIEF SUMMARY OF THE INVENTION

However, when the zener diode is provided between the sensor electrode and gate electrode, it is not possible to prevent the generation of zener leakage current that flows via the zener diode. As a result, gate drive loss of the semiconductor device increases. That is, a larger electric current must be supplied to the gate electrode to turn on the semiconductor device when compared with a case that the zener diode is not provided between the sensor electrode and gate electrode.

An objective of the present invention is to provide a technique that provides protection of the semiconductor device against damages caused by ESD and the like while simultaneously preventing the gate drive loss from increasing.

According to one aspect of the present teachings, the semiconductor device is provided with a protective device formed between the main electrode and the sensor electrode for discharging electrical charges. The protective device discharges electrical charges from the sensor electrode to the main electrode when excessive voltage such as ESD is applied between the sensor electrode and gate electrode. In this way, the destruction of gate insulating layers of the sensor switching elements can be prevented. Although the electrical charges are discharged to the main electrode, the gate insulating layers of the main switching elements will not be damaged because the gate input capacity of the main switching elements is large.

Further, because the protective device of the present invention is provided between the main electrode and sensor electrode, gate drive loss will not increase even if leakage current flows between the main electrode and sensor electrode via the protective device.

According to one aspect of the present teachings, the semiconductor device is provided with a semiconductor substrate having a plurality of switching elements formed within the semiconductor substrate. The switching elements are partitioned into at least two groups. The semiconductor device is further provided with a main electrode that is connected to one group of the switching elements (main switching elements). The main electrode is to be connected to a reference potential. The semiconductor device is further provided with a sensor electrode that is connected to the other group of the switching elements (sensor switching elements). The sensor electrode is to be connected to the reference potential via a current detector. The semiconductor device is further provided with a protective device coupling the main electrode and the sensor electrode. The protective device electrically connects the main electrode and the sensor electrode when a potential difference between the main electrode and the sensor electrode exceeds a predetermined voltage.

According to the above semiconductor device, when excessive voltage such as ESD is applied between the sensor electrode and gate electrodes of the sensor switching elements, the potential difference between the main electrode and the sensor electrode is generated. When the potential difference between the main electrode and the sensor electrode reaches the predetermined voltage, excessive electrical charges can be discharged from the sensor electrode to the main electrode via the protective device. As a result, voltage applied between the sensor electrode and gate electrodes of the sensor switching elements is prevented from increasing further. The destruction of the gate insulating layers of the sensor switching elements can be prevented. Further, because the protective device of the present invention is provided between the main electrode and sensor electrode, gate drive loss will not increase even if leakage current flows between the main electrode and sensor electrode via the protective device.

According to one aspect of the present teachings, it is preferable that the protective device is provided with a plurality of diodes connected in series between the main electrode and the sensor electrode. The diodes comprise at least one set of diodes disposed in opposite directions between the main electrode and the sensor electrode.

By providing the set of diodes, the main electrode and sensor electrode can be maintained at an electrically isolated state, given that the potential difference between the main electrode and sensor electrode does not exceed the breakdown voltage of the diodes. Within a range in which the potential difference between the main electrode and sensor electrode does not exceed the breakdown voltage of the diodes, the electric current that flows through the main electrode and the electric current that flows through the sensor electrode can flow separately. On the other hand, if the potential difference between the main electrode and sensor electrode exceeds the breakdown voltage of the diodes, the main electrode and sensor electrode become electrically connected.

By providing the set of diodes disposed in opposite directions, the electrical connection between the main electrode and sensor electrode can be switched on/off based on the breakdown voltage of the diodes.

According to one aspect of the present teachings, it is preferable that the protective device is provided within a part of the semiconductor layer stretching from the main electrode to the sensor electrode. It is preferable that the semiconductor layer comprises a first semiconductor region, a second semiconductor region and a third semiconductor region arranged in series. The first semiconductor region is connected to the main electrode, and contains impurities of a first conductivity type. The third semiconductor region is connected to the sensor electrode, and contains impurities of the first conductivity type. The second semiconductor region is disposed between the first semiconductor region and the second semiconductor region, and contains impurities of a second conductivity type.

According to the above protective device, a pn junction is formed between the first semiconductor region and second semiconductor region as well as between the second semiconductor region and third semiconductor region. The direction of the pn junctions face opposite directions between the main electrode and sensor electrode. In this way, the set of diodes can be disposed in opposite directions between the main electrode and sensor electrode.

According to one aspect of the present teachings, it is preferable that the predetermined voltage of the protective device at which the main electrode and the sensor electrode are connected is set to be higher than a maximum rated voltage between the main electrode and gate electrodes of the switching elements. And it is preferable that the predetermined voltage of the protective device is lower than a destruction voltage (destruction voltage) of the gate insulating layers of the sensor switching elements.

If the predetermined voltage of the protective device is higher than the maximum rated voltage between the main electrode and gate electrodes of the switching elements, the protective device can be prevented from being turned on improperly due to control signals applied to the gate electrode.

If the predetermined voltage of the protective device is lower than the destruction voltage of the gate insulating layers of the switching elements, the protective device is turned on before the gate insulating layers of the sensor switching elements are destroyed.

According to one aspect of the present teachings, when excessive voltage such as ESD is applied between the sensor electrode and gate electrodes of the sensor switching elements, excessive electrical charges can be discharged from the sensor electrode to the main electrode via the protective device. As a result, the gate insulating layers of the sensor switching elements can be prevented from being destroyed. Further, because the protective device of the present invention is provided between the main electrode and sensor electrode, gate drive loss will not increase even if leakage current flows between the main electrode and sensor electrode via the protective device.

According to one aspect of the present teachings, a semiconductor device can provide a measure against excessive voltage between the sensor electrode and gate electrodes of the sensor switching elements while simultaneously maintaining a low gate drive loss.

DETAILED DESCRIPTION OF THE INVENTION

Preferred features to practice the present invention are described below.
(First feature) A protective device having a pnp, npn, pnpnp, or npnpn conjunction is utilized.
(Second feature) The value calculated by dividing the magnitude of the electric current that flows through the sensor switching elements region by the magnitude of the electric current that flows through the entire semiconductor device is less than or equal to 0.01.
(Third feature) The semiconductor device is especially effective when the gate input capacity of the main switching elements is larger than a value calculated by dividing the amount of electrical charges supplied between terminals during an ESD tolerance test called "machine mode" by the destruction voltage of the gate insulating layer. That is, when the following condition is met, the semiconductor device of the invention is especially effective;

gate input capacity of main switching
elements>amount of electrical charges supplied
between terminals during an ESD tolerance test/
destruction voltage of the gate insulating layer Preferred Embodiment Embodiment of the present invention will be described in detail with reference to the accompanying drawings.

Figure 1:
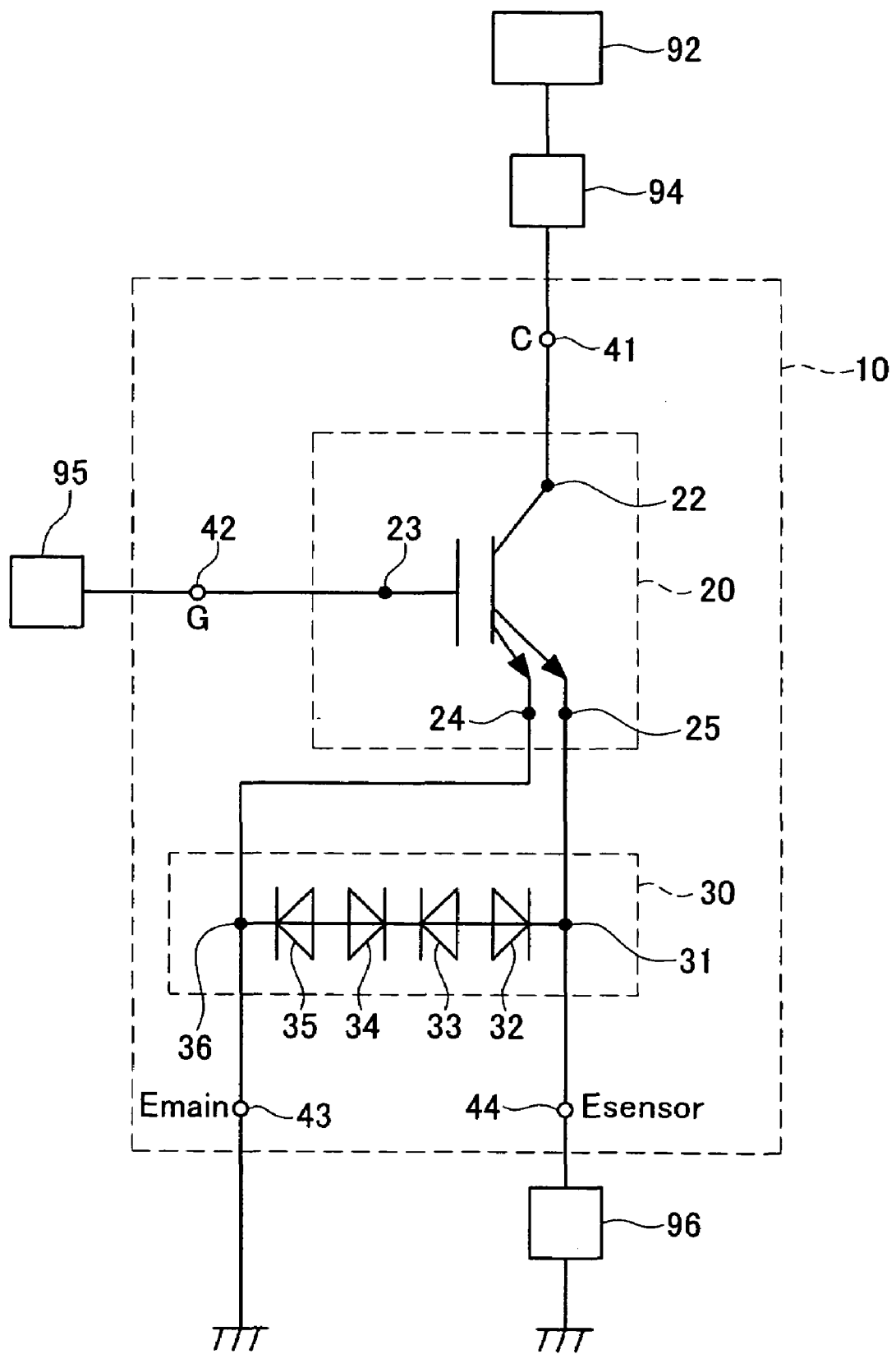
FIG. 1 shows a schematic circuit diagram of a semiconductor device.
Figure 2:
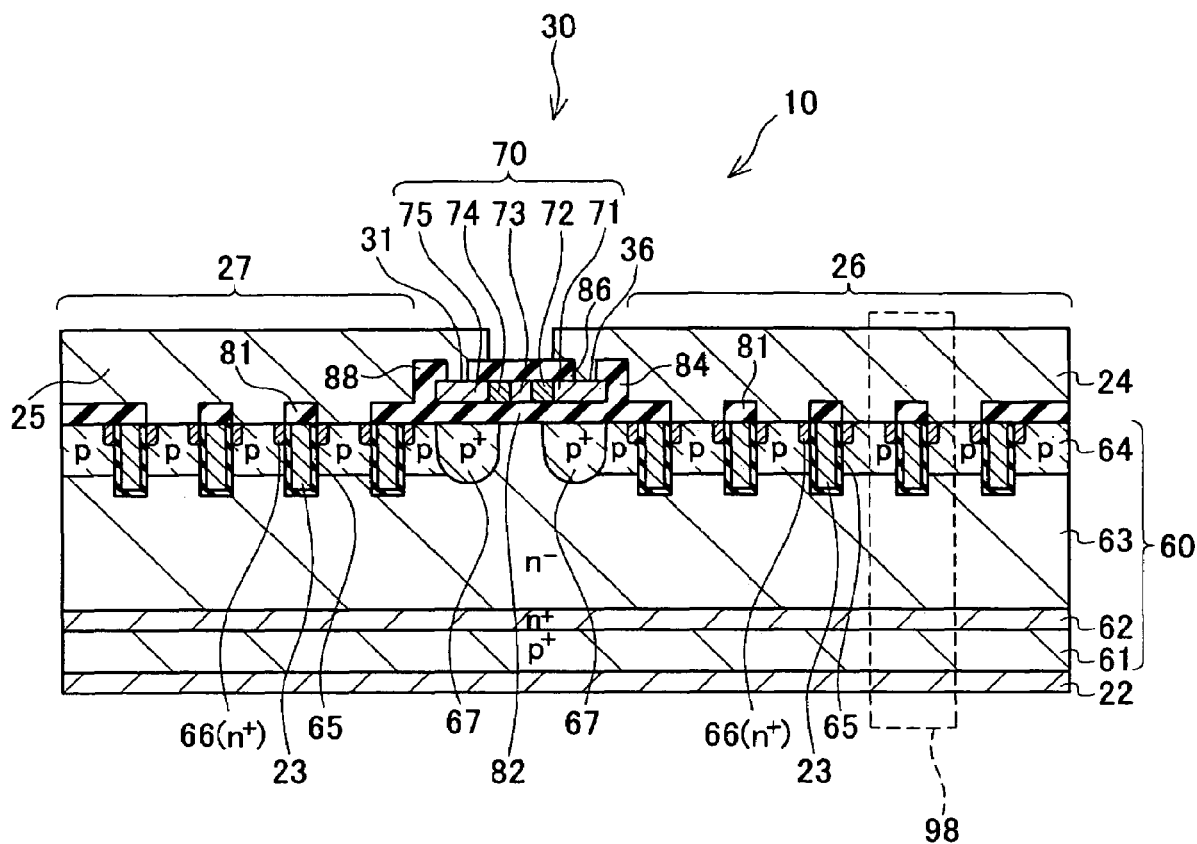
FIG. 2 shows a simplified cross-sectional diagram of a main portion of the semiconductor device.

FIG. 1 shows a schematic circuit diagram of semiconductor device 10. FIG. 2 shows a simplified cross-sectional diagram of a main portion of semiconductor device 10. Common reference numerals in FIGS. 1 and 2 represent common component elements. Semiconductor device 10 is used for turning on/off electric current to be supplied to a motor mounted on a hybrid car, fuel battery car, etc to invert-control the motor. In addition to semiconductor device 10, FIG. 1 shows power supply 92, motor 94, gate driving device 95, and current detector 96, which are connected to and used by semiconductor device 10.

As shown in FIG. 1, semiconductor device 10 is provided with switching element members 20 and protective device 30. Switching element members 20 are composed of a plurality of switching elements and temporarily switch the electric current on/off. By switching the electric current on/off with switching element members 20, semiconductor device 10 alternatively switches between a condition of supplying power to motor 94 and a condition of not supplying power to motor 94. Switching element members 20 are composed of a plurality of switching elements, each switching element having a basic structure of an IGBT (Insulated Gate Bipolar Transistor). Switching element members 20 are commonly connected to collector electrode 22, and gate electrode 23. An emitter electrode is partitioned into main electrode 24, and sensor electrode 25. The switching element members 20 are partitioned into two groups: a group connected in common to main electrode 24 and a group connected in common to sensor electrode 25. The number of switching elements that belong to the group connected in common to main electrode 24 is larger than the number of switching elements that belong to the group connected in common to sensor electrode 25. The switching elements connected to main electrode 24 are called "main switching elements." The switching elements connected to sensor electrode 25 are called "sensor switching elements."

Collector electrode 22 is electrically connected to collector terminal 41. Collector terminal 41 is electrically connected to motor 94. Motor 94 is electrically connected to power supply 92 that supplies direct voltage to motor 94 when semiconductor device 10 turns on.

Gate electrode 23 is electrically connected to gate terminal 42. Gate terminal 42 is electrically connected to gate driving device 95. Gate driving device 95 alternately supplies to gate electrode 23 a voltage to turn switching element members 20 on and a voltage to turn switching element members 20 off, via gate terminal 42.

Main electrode 24 is electrically connected to main terminal 43. Main terminal 43 is connected to ground potential (an example of a reference potential).

Sensor electrode 25 is electrically connected to sensor terminal 44. Sensor terminal 44 is connected to the ground potential via current detector 96. A current detecting circuit is utilized in current detector 96.

Protective device 30 is provided with a plurality of diodes 32, 33, 34, and 35, which are connected in series between first connection point 36 and second connection point 31. First connection point 36 is electrically connected to main electrode 24, and second connection point 31 is electrically connected to sensor electrode 25. Between first connection point 36 and second connection point 31, the diodes are disposed such that the forward direction of diodes 32 and 34 are opposite to the forward direction of diodes 33 and 35.

Next, the construction of semiconductor device 10 will be described with reference to FIG. 2. As will be explained below, graphic representation 98 constitutes one switching element 98. Semiconductor device 10 comprises a plurality of switching elements 98.

Semiconductor device 10 is provided with semiconductor substrate 60. A plurality of switching elements 98 is formed within semiconductor substrate 60. Semiconductor substrate 60 is partitioned into main switching elements region 26 and sensor switching elements region 27. Main switching elements region 26 corresponds to the area where main electrode 24 is formed, and sensor switching elements region 27 corresponds to the area where sensor electrode 25 is formed. A plurality of switching elements 98 having a common structure is repeatedly formed both at main switching elements region 26 and sensor switching elements region 27. In actuality, switching elements 98 are also repeatedly formed in the left-right direction beyond the page space. FIG. 2 shows a portion of that configuration.

Semiconductor device 10 is provided with collector electrode 22, collector region 61, field stop region 62, and drift region 63. Collector region 61 is formed on collector electrode 22, and is of p$^+$ type. Field stop region 62 is formed on collector region 61, and is of n$^+$ type. Drift region 63 is formed on field stop region 62, and is of n -type. Body region 64 of p-type is formed on a surface of drift region 63. A plurality of emitter regions 66 of n$^+$ type is selectively formed within body region 64. Drift region 63 and emitter region 66 are separated by body region 64. A plurality of gate electrodes 23 of trench type is formed so as to penetrate body region 64 at portions separating drift region 63 and emitter regions 66. Gate electrodes 23 face portions of body region 64, which separate emitter regions 66 and drift region 63 via gate insulating layers 65. Gate electrodes 23 penetrate body region 64 and extend to drift region 63. Gate electrodes 23 are separated from main electrode 24 and sensor electrode 25 by interlayer dielectric 81. Emitter regions 66 of main switching elements region 26 are electrically connected to main electrode 24. Emitter regions 66 of sensor switching elements region 27 are electrically connected to sensor electrode 25.

Semiconductor diffusion region 67 of p-type is formed between main switching elements region 26 and sensor switching elements region 27. Semiconductor diffusion region 67 is adjusted such that the impurity density is higher than body region 64. Semiconductor diffusion region 67 can improve the electrical insulation between main switching elements region 26 and sensor switching elements region 27.

Below, switching element 98 will be described in detail. Collector region 61, field stop region 62, drift region 63 and body region 64, which constitute a part of switching element 98, are formed between each switching element 98. On the other hand, gate electrode 23, gate insulating layer 65, and emitter region 66, which constitute the remainder of switching element 98, are not formed between each switching element 98. Therefore, each switching element 98 is identified by the gate construction, which is a combination of gate electrode 23, gate insulating layer 65, and emitter region 66. Specifically, one gate construction identifies a unit structure of one switching element.

Main electrode 24 of main switching elements region 26 and sensor electrode 25 of sensor switching elements region 27 are electrically insulated. Collector electrode 22 is common to both main switching elements region 26 and sensor switching elements region 27. Gate electrodes 23 of main switching elements region 26 and gate electrodes 23 of sensor switching elements region 27 are electrically connected to each other (portions of connection not shown). A common control signal is transmitted to the plurality of gate electrodes 23.

Since main electrode 24 and sensor electrode 25 are electrically isolated, current that flows through sensor switching elements region 27 can be separately retrieved from current that flows through main switching elements region 26. The electric current that flows through sensor switching elements region 27 flows through current detector 96. Therefore, the amount of electric current that flows through sensor switching elements region 27 can be detected by current detector 96.

The magnitude of the electric current that flows through each switching element is same among main switching elements region 26 and sensor switching elements region 27. Therefore, a proportional relationship between the number of the switching elements within main switching elements region 26 and the number of switching elements within sensor switching elements region 27 become equal to a proportional relationship between the magnitude of the electric current that flows through main electrode 24 and the magnitude of the electric current that flows through sensor electrode 27. Therefore, by detecting the magnitude of the electric current that flows through sensor electrode 27, the amount of current that flows through the main electrode 26 can be derived. The magnitude of electric current that flows through main switching elements region 26 can be calculated from the magnitude of electric current that flows through sensor switching elements region 27, the number of the switching elements within main switching elements region 26 and the number of switching elements within sensor switching elements region 27. As a result, for example, by monitoring the magnitude of electric current that flows through semiconductor device 10, it becomes possible to detect a phenomenon that an abnormal electric current flows semiconductor device 10 that is caused when motor 94 or like components connected to semiconductor device 10 is short circuited. Therefore, when a short circuit occurs on motor 94 or the like, semiconductor device 10 can be mandatorily turned off to prevent excessive electric current from flowing through semiconductor device 10.

As shown in FIG. 2, semiconductor device 10 is provided with protective device 30, which is formed on a surface of semiconductor substrate 60. Protective device 30 is provided with semiconductor layer 70 made of polysilicon and insulating layers 82, 84, 86, and 88 made of oxide silicon. Insulating layers 82, 84, 86, and 88 cover semiconductor layer 70. Semiconductor layer 70 is formed between main electrode 24 and sensor electrode 25. Insulating layer 82 covers the bottom surface of semiconductor layer 70. Side surface insulating layers 84 and 88 cover the side surface of semiconductor layer 70. Upper surface insulating layer 86 covers the upper surface of semiconductor layer 70. Bottom surface insulating layer 82 can be formed with a common manufacturing process as interlayer dielectric 81. Two openings are formed on a portion of upper surface insulating layer 86. A portion of semiconductor layer 70 contacts main electrode 24 via one of the openings (corresponds to first connection point 36 of FIG. 1), and another portion of semiconductor layer 70 contacts sensor electrode 25 via the other opening (corresponds to second connection point 31 of FIG. 1).

Semiconductor layer 70 is provided with first semiconductor region 71, second semiconductor region 72, third semiconductor region 73, fourth semiconductor region 74, and fifth semiconductor region 75, which are disposed serially between main electrode 24 and sensor electrode 25.

First semiconductor region 71 is electrically connected to main electrode 24 via first contact point 36, and contains impurities of n-type. Second semiconductor region 72 makes contact with first semiconductor region 71, and is separated from main electrode 24 by first semiconductor region 71. Second semiconductor region 72 contains impurities of p-type. Third semiconductor region 73 makes contact with second semiconductor region 72, and is separated from first semiconductor region 71 by second semiconductor region 72. Third semiconductor region 73 contains impurities of n-type. Fourth semiconductor region 74 makes contact with third semiconductor region 73, and is separated from second semiconductor region 72 by third semiconductor region 73. Fourth semiconductor region 74 contains impurities of p-type. Fifth semiconductor region 75 makes contact with fourth semiconductor region 74, and is separated from third semiconductor region 73 by fourth semiconductor region 74. Fifth semiconductor region 75 contains impurities of n-type. Fifth semiconductor region 75 is electrically connected to sensor electrode 25 via second connection point 31.

As shown in FIG. 1, first diode 32 is formed by a pn junction between first semiconductor region 71 and second semiconductor region 72. Second diode 33 is formed by a pn junction between second semiconductor region 72 and third semiconductor region 73. Third diode 34 is formed by a pn junction between third semiconductor region 73 and fourth semiconductor region 74. Fourth diode 35 is formed by a pn junction between fourth semiconductor region 74 and fifth semiconductor region 75. The forward direction of first diode 32 and third diode 34 is the direction from main electrode 24 to sensor electrode 25. The forward direction of second diode 33 and fourth diode 35 is the direction from sensor electrode 25 to main electrode 24.

Next, the function of protective device 30 will be explained. During a manufacturing process of semiconductor device 10, excessive voltage such as ESD can be applied to semiconductor device 10 due to various causes. If sensor switching elements region 27 for detecting current is disposed in the semiconductor device, as with the present embodiment, there is a problem in that gate insulating layers 65 of sensor switching elements region 27 are easily destroyed. This problem is due to the following reason.

The number of switching elements 98 formed within sensor switching elements region 27 is smaller than the number of switching elements 98 formed within main switching elements region 26. Therefore, the gate input capacity between sensor electrode 25 and gate electrodes 23 (correlates to the area of gate insulating layer 65) of sensor switching elements region 27 is smaller than the gate input capacity between main electrode 24 and gate electrodes 23 of main switching elements region 26. Because the gate input capacity of main switching elements region 26 is large, the ESD tolerance between main electrode 24 and gate electrodes 23 of main switching elements region 26 is high. On the other hand, because the gate input capacity of sensor switching elements region 27 is small, the ESD tolerance between sensor electrode 25 and gate electrodes 23 of sensor switching elements region 27 is low. Therefore, when ESD is applied between sensor electrode 25 and gate electrodes 23, gate insulating layers 65 of sensor switching elements region 27 can be easily destroyed unless some measure is taken.

Semiconductor device 10 of the present implementation is provided with protective device 30. When ESD is applied between sensor electrode 25 and gate electrodes 23 of sensor switching elements region 27, protective device 30 can discharge electrical charges from sensor electrode 25 to main electrode 24. Specifically, when ESD is applied between sensor electrode 25 and gate electrodes 23 of sensor switching elements region 27, and a predetermined potential difference results between sensor electrode 25 and main electrode 24, protective device 30 electrically connects main electrode 24 and sensor electrode 25 by short-circuiting a portion of diodes 32, 33, 34, and 35 disposed within protective device 30. As a result, excessive voltage can be prevented from being applied to gate insulating layers 65 of sensor switching elements region 27. This prevents gate insulating layers 65 of sensor switching elements region 27 from being destroyed. Further, even if electrical charges are discharged from sensor electrode 25 to main electrode 24, gate insulating layers 65 of main switching elements region 26 are not damaged because the gate input capacity of main switching elements region 26 is large.

During a manufacturing process of semiconductor device 10, a test that forcibly applies electrical charges between terminals of semiconductor device 10 (for example, ESD tolerance tests called "man mode" and "machine mode") is implemented in order to evaluate the tolerance of semiconductor device 10 against ESD. The ESD tolerance test is also implemented for sensor electrode 24 and gate electrode 23. As described above, the ESD tolerance between sensor electrode and gate electrodes of sensor switching elements region 26 is low in prior art. Therefore, when standard "man mode" or "machine mode" ESD tolerance tests are implemented on a semiconductor device of prior art, the gate insulating layers of the sensor switching elements region are frequently destroyed. On the other hand, even if standard "man mode" or "machine mode" ESD tolerance tests are implemented on semiconductor device 10, gate insulating layers 65 of sensor switching elements region 27 can be prevented from damaged because semiconductor device 10 of the present implementation is provided with protective device 30.

Within protective device 30, the forward direction of first diode 32 and third diode 34 is opposite the forward direction of second diode 33 and fourth diode 35. The discharge of electrical charge from sensor electrode 25 to main electrode 24 occurs when the electrical potential on sensor electrode 25 is higher than the electrical potential on main electrode 24, and the potential difference between sensor electrode 25 and main electrode 24 exceeds the cumulative breakdown voltage of first diode 32 and third diode 34. On the other hand, the discharge of electrical charge from main electrode 24 to sensor electrode 25 occurs when the electrical potential on main electrode 24 is higher than the electrical potential on sensor electrode 25, and the potential difference between sensor electrode 25 and main electrode 24 exceeds the cumulative breakdown voltage of second diode 33 and fourth diode 35. Therefore, protective device 30 can maintain a nonconductive condition between main electrode 24 and sensor electrode 25 as long as the potential difference between sensor electrode 25 and main electrode 24 does not exceed the total breakdown voltage of first diode 32 and third diode 34. Similarly, protective device 30 can maintain a nonconductive condition between main electrode 24 and sensor electrode 25 as long as the potential difference between main electrode 24 and sensor electrode 25 does not exceed the total breakdown voltage of second diode 33 and fourth diode 35. Under normal operation, the nonconductive condition between main electrode 24 and sensor electrode 25 is maintained because a large potential difference is not generated between main electrode 24 and sensor electrode 25. Therefore, under normal operation, the current that flows through main electrode 24 and the current that flows through sensor electrode 25 can be separated. Under normal operation, by separating the current that flows through main electrode 24 and the current that flows through sensor electrode 25, the precision of the current value detected by current detector 96 can be improved.

Further, the potential difference at which protective device 30 is short-circuited can be adjusted by the number of diodes disposed within protective device 30.

Further, as described in the background of the invention, a technique exists wherein a zener diode is disposed between an emitter electrode of sensor switching elements and a gate electrode so as to improve the ESD tolerance between the emitter electrode of sensor switching elements and the gate electrode. However, by disposing the zener diode, the occurrence of zener leakage current becomes unavoidable. Therefore, with the prior art technique of utilizing the zener diode, there is a problem in that gate leakage current increases, which also increases gate drive loss of the semiconductor device.

Contrarily, with semiconductor device 10 of the present embodiment, gate leakage current does not increase even if leakage current flows between main electrode 24 and sensor electrode 25.

Figure 3:
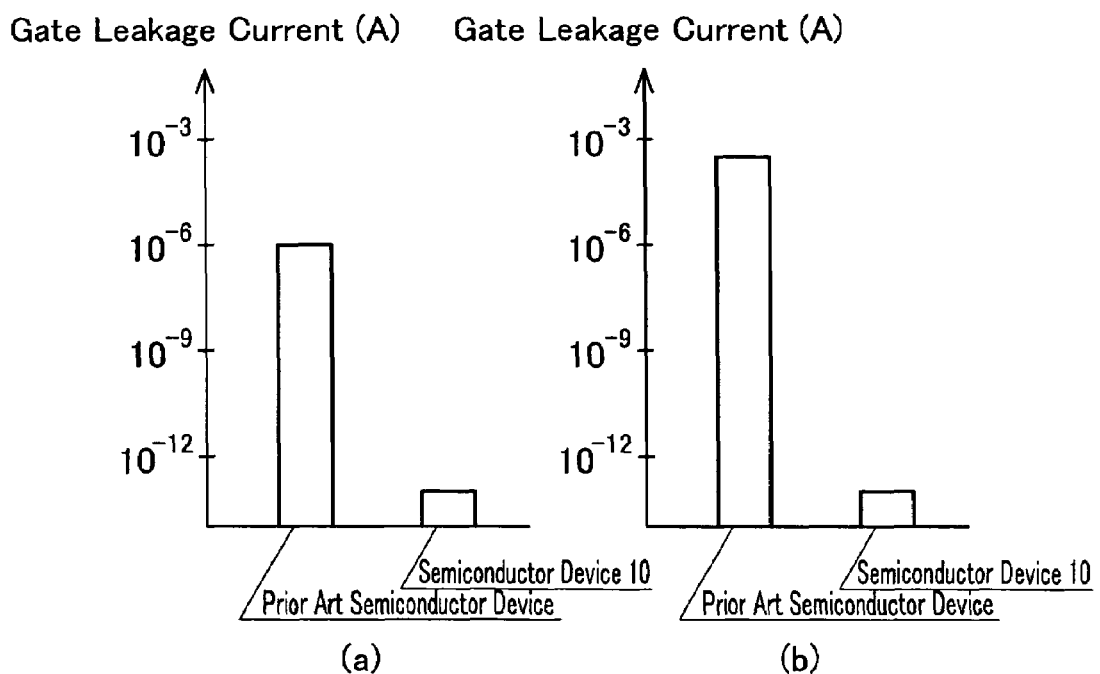
FIG. 3(a) shows the magnitude of gate leakage current at 25 degrees Celsius.
FIG. 3(b) shows the magnitude of gate leakage current at 150 degrees Celsius.

FIG. 3 shows the magnitude of gate leakage current of a prior art semiconductor device that utilizes the zener diode and the magnitude of gate leakage current of semiconductor device 10 of the present embodiment. FIG. 3(a) shows a case where the temperature of the semiconductor devices is 25 degrees Celsius. FIG. 3(b) shows a case where the temperature of the semiconductor devices is 150 degrees Celsius.

At both temperatures, it can be seen that semiconductor device 10 of the present embodiment has a significantly smaller magnitude of gate leakage current. Further, in the prior art semiconductor device, the magnitude of gate leakage current changes with respect to temperature change of the semiconductor device. On the other hand, in semiconductor device 10 of the present embodiment, the change in the magnitude of gate leakage is suppressed regardless the temperature of semiconductor device 10. Semiconductor device 10 is stable against temperature change. Gate leakage of semiconductor device 10 is maintained at a low level regardless the temperature of semiconductor device 10.

Semiconductor device 10 of the present embodiment can minimize gate drive loss because the gate leakage current is minimal. With semiconductor 10 of the present embodiment, the problem of ESD between sensor electrode 25 and gate electrodes 23 of the sensor switching elements region 27 can be solved while minimizing gate drive loss.

Further, when semiconductor 10 is turned on and even if leakage current flows between main electrode 24 and sensor electrode 25 via protective device 30, the magnitude of leakage current that flows through protective device 30 is substantially small. Therefore, even if leakage current occurs, the detection ability of current detector 96 is not adversely affected.

Below, other characteristics of semiconductor device 10 of the present embodiment are described.

(1) It is preferable that the value that the magnitude of current that flows through sensor switching elements region 27 divided by the magnitude of current that flows through the entire semiconductor 10 (called current sensing ratio) is less than or equal to 0.01. In order to realize this value, the value that the number of switching elements 98 formed within sensor switching elements region 27 divided by the cumulative number of switching elements 98 formed on the entire semiconductor device 10 should be less than or equal to 0.01. The smaller the ratio, the more enhanced the detection ability of the magnitude of electric current flowing through semiconductor device 10 becomes. If the aforementioned ratio is attained, the gate input capacity of sensor switching elements region 27 becomes smaller than the gate input capacity of main switching elements region 26, and the ESD tolerance of sensor switching elements region 27 generally becomes smaller. In such a case, by providing protective device 30, as is the case with semiconductor device 10, the ESD tolerance between sensor electrode 25 and gate electrode 23 can be improved. Specifically, if the current sensing ratio is less than or equal to 0.01, protective device 30 can achieve significantly positive effects. If the current sensing ratio is less than or equal to 0.01, semiconductor device 10 with protective device 30 can improve the detection ability of the amount of current as well as the ESD tolerance.

(2) With a semiconductor device of prior art that has a zener diode disposed between a sensor electrode of a sensor switching elements region and gate electrode, problems could occur when implementing a gate screening test. A gate screening test refers to a test for screening defective gate structures (typically gate insulating film) by grounding all terminals of a semiconductor device with the exception of gate terminals, and applying a predetermined voltage to the gate terminals. The predetermined voltage to be applied to the gate terminals is usually 70-80% of the voltage that would be required to destroy the gate insulating film. However, if a zener diode is disposed between the sensor electrode of the sensor switching elements region and the gate electrode, just like the prior art, a voltage that is larger than the breakdown voltage of the zener diode cannot be applied to the gate terminal. Therefore, defective gate insulating films cannot be screened out with the gate screening test.

On the other hand, with semiconductor device 10, it is possible to apply sufficiently large voltage to gate terminal 42 because gate terminal 42 is insulated from other terminals. Therefore, the necessary voltage for the gate screening test can be applied to gate terminal 42. As a result, defective gate insulating films 65 can be screened out.

(3) Generally, in order to evaluate ESD tolerance of semiconductor device 10, an ESD tolerance test called "machine mode" is implemented, where electrical charges are forcibly applied between terminals of semiconductor device 10. It is preferable that the gate input capacity of main switching elements region 26 of semiconductor device 10 is larger than a value calculated by dividing the amount of electrical charges supplied between terminals (during the machine mode ESD tolerance test) by the destruction tolerance (destruction voltage) of the gate insulating films. The gate input capacity of main switching elements region 26 can be effectively increased by, for example, increasing the number of switching elements formed within main switching elements region 26.

If the above conditions are satisfied, the destruction of gate insulating films 65 of main switching elements region 26 can be prevented during the machine mode ESD tolerance test. In a standard machine mode ESD tolerance test, 200(V) is commonly used as the power source when supplying the electrical charges, and 200(pF) is commonly used for a condenser used to collect the electrical charges. Therefore, it is preferable that the gate input capacity of main switching elements region 26 is adjusted to be larger than the value calculated below.

$$200(V) \times 200(pF)/\text{destruction tolerance of gate insulating films 65}$$

The destruction tolerance of gate insulating films 65 is typically approximately 80V. Therefore, it is preferable that the gate input capacity of main switching elements region 26 calculated by the above formula is adjusted to be larger than 500(pF).

Figure 4:
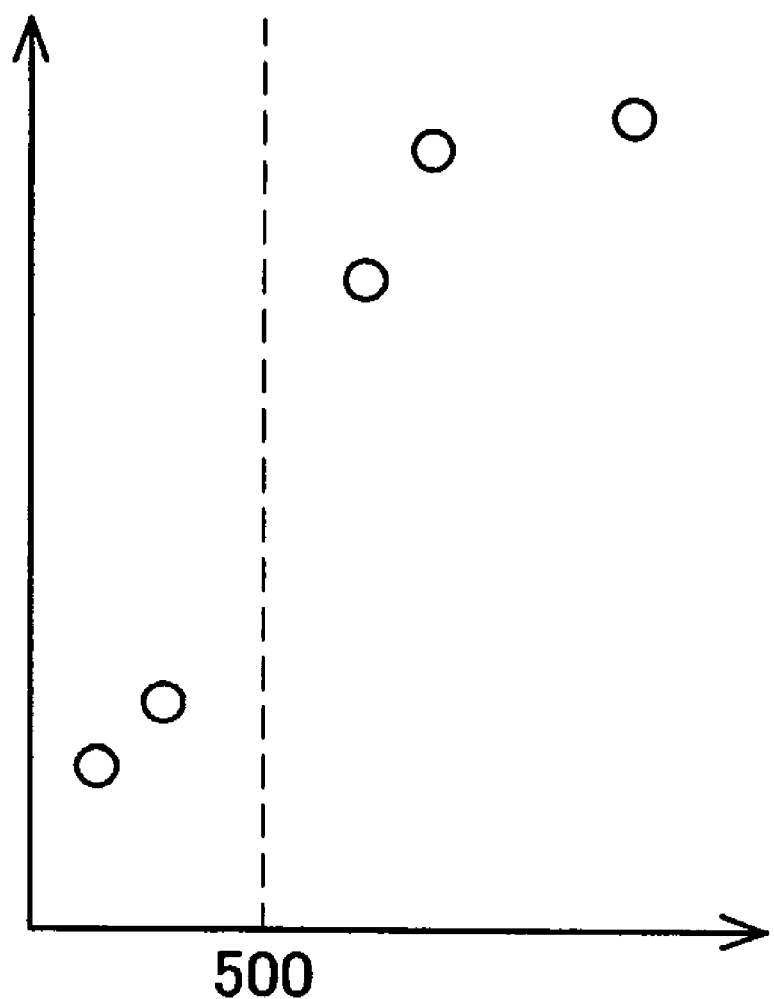
FIG. 4 shows the relationship between the amount of gate emitter capacity and electrostatic tolerance Of the semiconductor device.

FIG. 4 shows a relationship between gate input capacity of main switching elements region 26 and electrostatic tolerance of semiconductor device 10.

As shown in FIG. 4, the electrostatic tolerance of semiconductor device 10 becomes significantly larger when the gate input capacity exceeds 500 pF. As described above, when the gate input capacity is larger than 500 pF, gate insulating layers 65 of main switching elements region 26 can be prevented from being destroyed. Semiconductor device 10 also utilizes protective device 30 and also prevents gate insulating layers 65 of sensor switching elements region 27 from being destroyed. Even if electrical charges are discharged via protective device 30 from sensor electrode 25 of sensor switching elements region 27 to main electrode 24 of main switching elements region 26, gate insulating layers 65 of main switching elements region 26 can be prevented from being destroyed. Therefore, gate insulating layers 65 are prevented from being destroyed in both main switching elements region 26 and sensor switching elements region 27. Accordingly, the electrostatic tolerance of semiconductor device 10 becomes significantly larger when the gate input capacity exceeds 500 pF.

(4) Protective device 30 can be formed on a surface of semiconductor substrate 60 by utilizing a process for manufacturing semiconductor device 10. There is no substantial increase in manufacturing cost by manufacturing protective device 30. Further, there is no increase in size because protective device 30 is integrated within semiconductor 10.

(5) Protective device 30 may further comprise resistors disposed serially against diodes 32, 33, 34, and 35. These additional resistors are preferably formed by utilizing a process of manufacturing semiconductor device 10. For example, the additional resistors may be formed by make contact with semiconductor layer 70 of protective device 30, and may be attained by forming a region with adjusted impurity density.

By providing such typed of additional resistors, the magnitude of electric current that flows through protective device 30 can be controlled. As a result, ESD tolerance between sensor electrode 25 of sensor switching elements region 27 and gate electrode 23 can be improved even if the pn junction area of diodes 32, 33, 34, and 35 provided on protective device 30 is not sufficient. Further, by providing the additional resistors, semiconductor device 10 can be made more compact because the pn junction area of diodes 32, 33, 34, and 35 can be made smaller.

(6) The DC tolerance between main switching elements region 26 and sensor switching elements region 27 varies largely depending on design, but is usually between few volts to few tens of volts. Therefore, it can be understood that a bulk diode is embedded between main switching elements region 26 and sensor switching elements region 27. Therefore, if the tolerance between main switching elements region 26 and sensor switching elements region 27 is lower than the protective device 30, it may seem that the bulk diode provides protection. However, this is not the case. In actuality, the tolerance of the bulk diode disposed between main switching elements region 26 and sensor switching elements region 27 is a few hundred volts. Therefore, the bulk diode cannot be expected to provide protection as a protective device against ESD. Therefore, even if the protective device 30 is used with higher tolerance than the tolerance between main switching elements region 26 and sensor switching elements region 27, destruction of the gate insulating layers due to ESD can be prevented as long as the tolerance of the protective device 30 is less than or equal to the tolerance of the gate insulating layers 65.

Examples of specific embodiments of the present invention have been described in detail above. However, the described embodiments are merely examples, and therefore do not limit the scope of the claims of the present invention. Various modifications and adjustments may be made to the techniques described within the scope of the claims of the present invention.

Further, technical elements described in the present specification and or figures produces technical utility either independently or as combinations, and are not limited by the combinations described in the claims at the time the present application is filed. Further, the techniques described in the present specification or figures can simultaneously achieve a number of objectives, and achieving any one of those objectives give technical utility to the present invention.

What is claimed is:

1. A semiconductor device comprising:
    a semiconductor substrate having a plurality of switching elements formed therein, the switching elements having a common structure comprising a semiconductor region, the semiconductor region of the common structure being identical among the switching elements and the switching elements being partitioned into at least two groups;
    a main electrode connected to the semiconductor regions of the switching elements belonging to one group of the switching elements and to be connected to a reference potential;
    a sensor electrode connected to the semiconductor regions of the switching elements belonging to the other group of the switching elements and to be connected to the reference potential via a current detector; and
    a protective device comprising a plurality of diodes, connected in series so that current flow directions of the diodes, are opposite, formed between the main electrode and the sensor electrode,
    wherein the protective device electrically connects the main electrode and the sensor electrode when a potential difference between the main electrode and the sensor electrode exceeds a breakdown voltage of at least one of the diodes in the protective device.

2. The semiconductor device of claim 1, wherein the protective device comprises:
    a semiconductor layer stretching from the main electrode to the sensor electrode, wherein the semiconductor layer comprises:
    a first semiconductor region connected to the main electrode and containing impurities of a first conductivity type;
    a third semiconductor region connected to the sensor electrode and containing impurities of the first conductivity type; and
    a second semiconductor region disposed between the first semiconductor region and the third semiconductor region, and containing impurities of a second conductivity type.

3. The semiconductor device of claim 1, wherein the breakdown voltage of the protective device at which the main electrode and the sensor electrode are connected is set to be higher than a maximum rated voltage between the main electrode and a gate electrodes of the switching elements, and the breakdown voltage of the protective device is lower than a destruction tolerance of a gate insulating layer.

* * * * *